US012685196B2

(12) United States Patent
Kwon et al.

(10) Patent No.: US 12,685,196 B2
(45) Date of Patent: Jul. 14, 2026

(54) STRIP SUBSTRATE AND SEMICONDUCTOR PACKAGE INCLUDING THE SAME

(71) Applicant: Samsung Electronics Co., Ltd., Suwon-si (KR)

(72) Inventors: Jinmo Kwon, Suwon-si (KR); Jitaek Oh, Suwon-si (KR); Hyoungjoon Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 374 days.

(21) Appl. No.: 18/474,336

(22) Filed: Sep. 26, 2023

(65) Prior Publication Data

US 2024/0266276 A1     Aug. 8, 2024

(30) Foreign Application Priority Data

Feb. 3, 2023     (KR) ........................ 10-2023-0014736

(51) Int. Cl.
H10W 70/65          (2026.01)
H10W 70/05          (2026.01)
(Continued)

(52) U.S. Cl.
CPC ...........  H10W 70/65 (2026.01); H10W 70/05 (2026.01); *H10W 70/685* (2026.01);
(Continued)

(58) Field of Classification Search
CPC . H01L 21/48; H01L 21/4846; H01L 21/4857; H01L 22/00; H01L 23/00; H01L 23/13; H01L 23/31; H01L 23/3128; H01L 23/498; H01L 23/49816; H01L 23/49822;

H01L 23/49827; H01L 23/49833; H01L 23/49838; H01L 23/4985; H01L 23/49861; H01L 23/544; H01L 24/10; H01L 24/18; H01L 24/16; H01L 24/26; H01L 24/32; H01L 24/34; H01L 24/42; H01L 24/50; H01L 24/63; H01L 24/71; H01L 24/73; H01L 2223/54453; H01L 2224/16227;

(Continued)

(56) References Cited

U.S. PATENT DOCUMENTS 7,154,048 B2    12/2006  Kikuchi et al.
7,349,224 B2     3/2008  Ohsaka
(Continued)

FOREIGN PATENT DOCUMENTS

JP     2007266492 A    10/2007
KR      100708046 B1    4/2007
KR     20070105421 A    10/2007

*Primary Examiner* — Brook Kebede
(74) *Attorney, Agent, or Firm* — Wolf, Greenfield & Sacks, P.C.

(57) ABSTRACT

A strip substrate comprises a dielectric layer comprising a unit region and a saw line region, a saw line pattern on the saw line region, a conductive dummy pattern extending from the saw line pattern and toward the unit region, and power/ground patterns on the unit region. The power/ground pattern includes a first lateral surface that extends in a first direction and is proximate to the saw line pattern, a second lateral surface that extends in a second direction and is proximate to the conductive dummy pattern, and a third lateral surface that connects the first lateral surface and the second lateral surface.

20 Claims, 17 Drawing Sheets

(51) Int. Cl.
*H10W 70/685* (2026.01)
*H10W 74/15* (2026.01)
*H10W 90/00* (2026.01)

(52) U.S. Cl.
CPC .......... *H10W 74/15* (2026.01); *H10W 90/724* (2026.01); *H10W 90/734* (2026.01)

(58) Field of Classification Search
CPC .......... H01L 2224/32225; H01L 2224/73204; H10W 46/00; H10W 46/501; H10W 70/04; H10W 70/05; H10W 70/63; H10W 70/635; H10W 70/65; H10W 70/68; H10W 70/685; H10W 72/00; H10W 72/20; H10W 72/30; H10W 72/851; H10W 74/10; H10W 74/15; H10W 74/117; H10W 90/00; H10W 90/701; H10W 90/724; H10W 90/734

See application file for complete search history.

(56) References Cited

U.S. PATENT DOCUMENTS

| | | | | |
|---|---|---|---|---|
| 7,384,566 | B2 | 6/2008 | Chen et al. | |
| 8,253,032 | B2 | 8/2012 | Kim et al. | |
| 8,884,435 | B2 | 11/2014 | Ichiki | |
| 2014/0167276 | A1* | 6/2014 | Kim | H01L 23/49827 257/773 |
| 2016/0181195 | A1* | 6/2016 | Kim | H01L 23/60 257/668 |
| 2019/0237398 | A1 | 8/2019 | Yu et al. | |
| 2022/0199510 | A1* | 6/2022 | Jung | H01L 23/49816 |

* cited by examiner

STRIP SUBSTRATE AND SEMICONDUCTOR PACKAGE INCLUDING THE SAME

CROSS-REFERENCE TO RELATED APPLICATION

This U.S. nonprovisional application claims priority under 35 U.S.C § 119 to Korean Patent Application No. 10-2023-0014736 filed on Feb. 3, 2023 in the Korean Intellectual Property Office, the disclosure of which is hereby incorporated by reference in its entirety.

BACKGROUND

The present disclosure relate to a semiconductor package, and more particularly, to a semiconductor package fabricated by a strip substrate.

A semiconductor package may be fabricated by mounting a semiconductor chip on a package substrate (e.g., a printed circuit board (PCB)), and then using bonding wires or bumps to electrically connect the semiconductor chip to the package substrate. When the package substrate is damaged, the semiconductor package functionality may be inhibited.

SUMMARY

Some embodiments of the present disclosure provide a highly reliable strip substrate and method of fabricating the same.

Some embodiments of the present disclosure provide a semiconductor package with increased reliability.

According to some embodiments of the present disclosure, a strip substrate may comprise: a dielectric layer comprising a unit region and a saw line region; a saw line pattern on the saw line region of the dielectric layer; a conductive dummy pattern that extends from the saw line pattern and toward the unit region; and a plurality of power/ground patterns on the unit region. The conductive dummy pattern is between the plurality of power/ground portions. Each of the power/ground patterns may include: a first lateral surface that extends in a first direction and is proximate to the saw line pattern; a second lateral surface that extends in a second direction and is proximate to the conductive dummy pattern, where the second direction intersects the first direction; and a third lateral surface that connects the first lateral surface and the second lateral surface.

According to some embodiments of the present disclosure, a semiconductor package may comprise: a package substrate comprising a lateral surface, a top surface, and a bottom surface that is opposite to the top surface; a semiconductor chip on the top surface of the package substrate; and a solder terminal on the bottom surface of the package substrate. The package substrate may include: a dielectric layer comprising; a solder pad between the solder terminal and the dielectric layer; a conductive dummy pattern on the dielectric layer and extending from the solder pad toward the lateral surface of the package substrate, wherein a portion of the conductive dummy pattern is exposed at the lateral surface of the package substrate; and a plurality of power/ground patterns proximate to the lateral surface and on the dielectric layer. The conductive dummy pattern is between the plurality of power/ground patterns. The power/ground pattern may include: a first part; and a second part between the first part and the lateral surface of the package substrate. A first distance between the first part and the conductive dummy pattern in a first direction is constant. A second distance between the second part and the conductive dummy pattern in a second direction increases as a third distance between the second part and the lateral surface of the package substrate in the first direction decreases. The second direction intersects the first direction.

According to some embodiments of the present disclosure, a strip substrate may comprise: a dielectric layer; a saw line pattern that extends in a first direction on the dielectric layer; a plurality of metal plate patterns spaced apart from each other in the first direction; a solder pad on the dielectric layer; a conductive dummy pattern that extends from the solder pad and between the plurality of metal plate patterns, wherein the conductive dummy pattern is connected to the saw line pattern; and a dielectric protection layer on the dielectric layer, the saw line pattern, the metal plate patterns, and the conductive dummy pattern. A first distance between the plurality of metal plate patterns and the conductive dummy pattern may be in a range of about 10 micrometers to about 30 micrometers. A second distance between the plurality of metal plate patterns and the saw line pattern may be in a range of about 50 micrometers to about 150 micrometers. Each of the metal plate patterns comprises a chamfer shape at a corner proximate to an intersection between the saw line pattern and the conductive dummy pattern.

BRIEF DESCRIPTION OF DRAWINGS

FIGS. 9, 10, 11, 12, 13, 14, 15, and 16 illustrate a sawing process for a strip substrate according to some embodiments of the present disclosure.

DETAILED DESCRIPTION OF EMBODIMENTS

Figure 1:
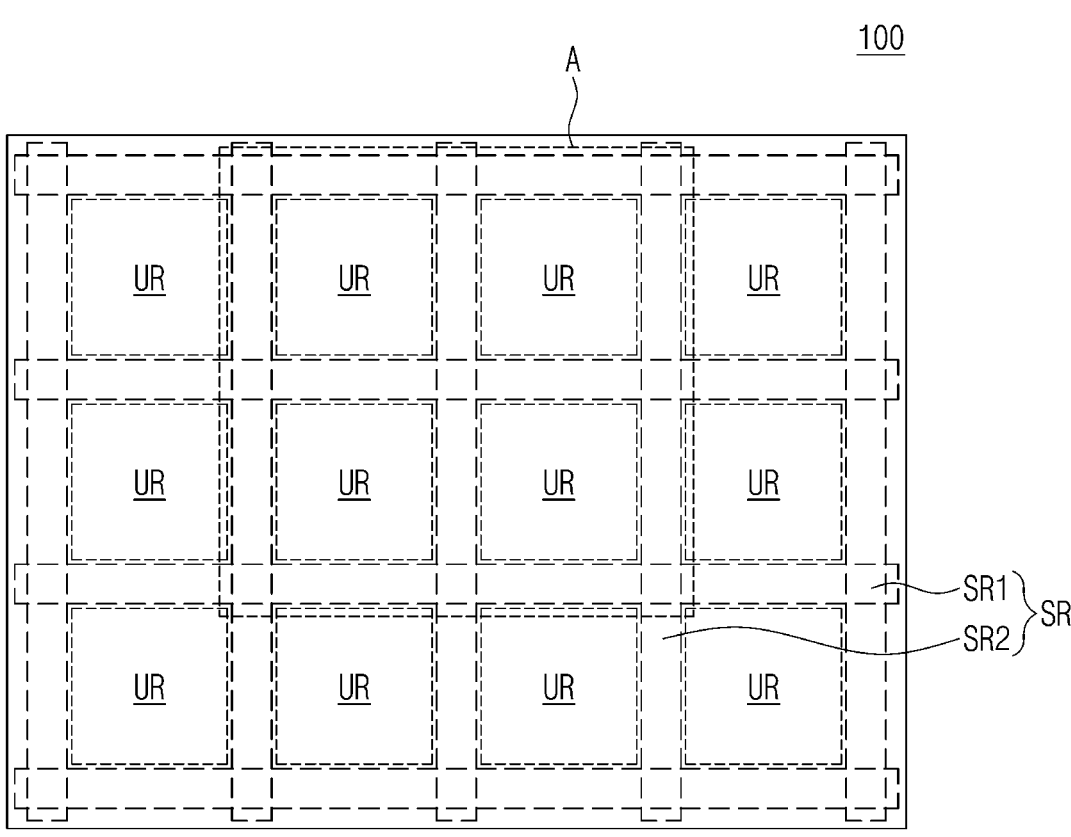
FIG. 1 illustrates a plan view of a strip substrate according to some embodiments of the present disclosure.
Figure 1:
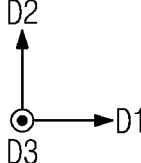

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the phrase "at least one of A, B, and C" refers to a logical (A OR B OR C) using a non-exclusive logical OR, and should not be construed to mean "at least one of A, at least one of B and at least one of C." As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items. The term "connected" may be used herein to refer to a physical and/or electrical connection and may refer to a direct or indirect physical and/or electrical connection.

The following will now describe a strip substrate according to the present disclosure with reference to the accompanying drawings.

Figure 2:
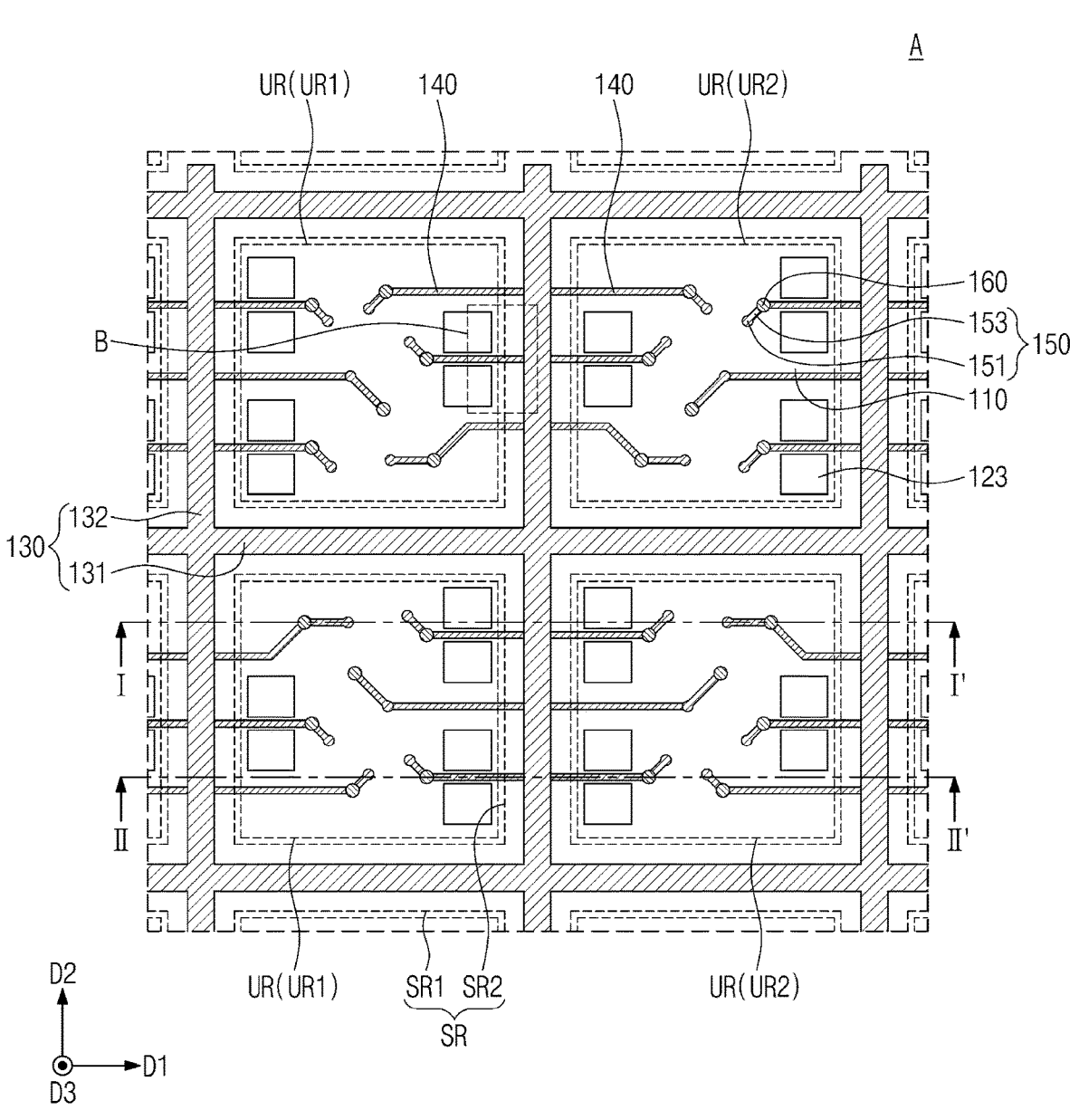
FIG. 2 illustrates an enlarged view showing section A of FIG. 1.
Figure 3:
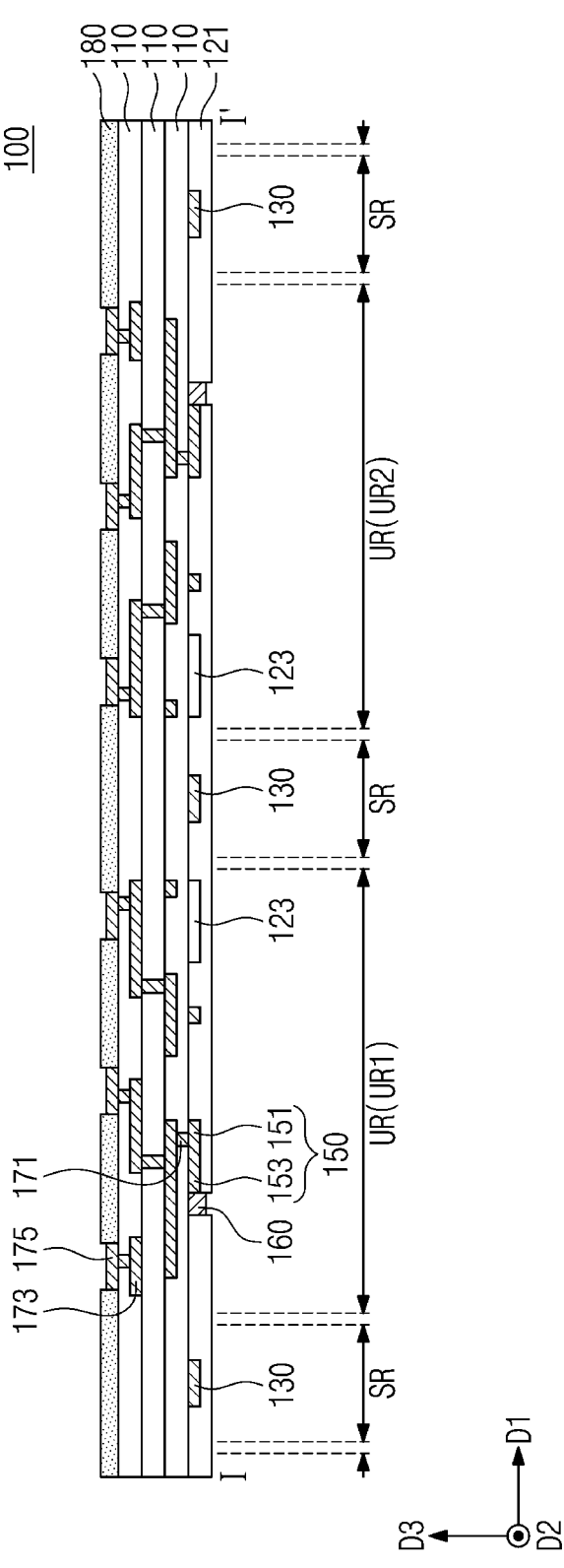
FIG. 3 illustrates a cross-sectional view taken along line I-I' of FIG. 2.
Figure 4:
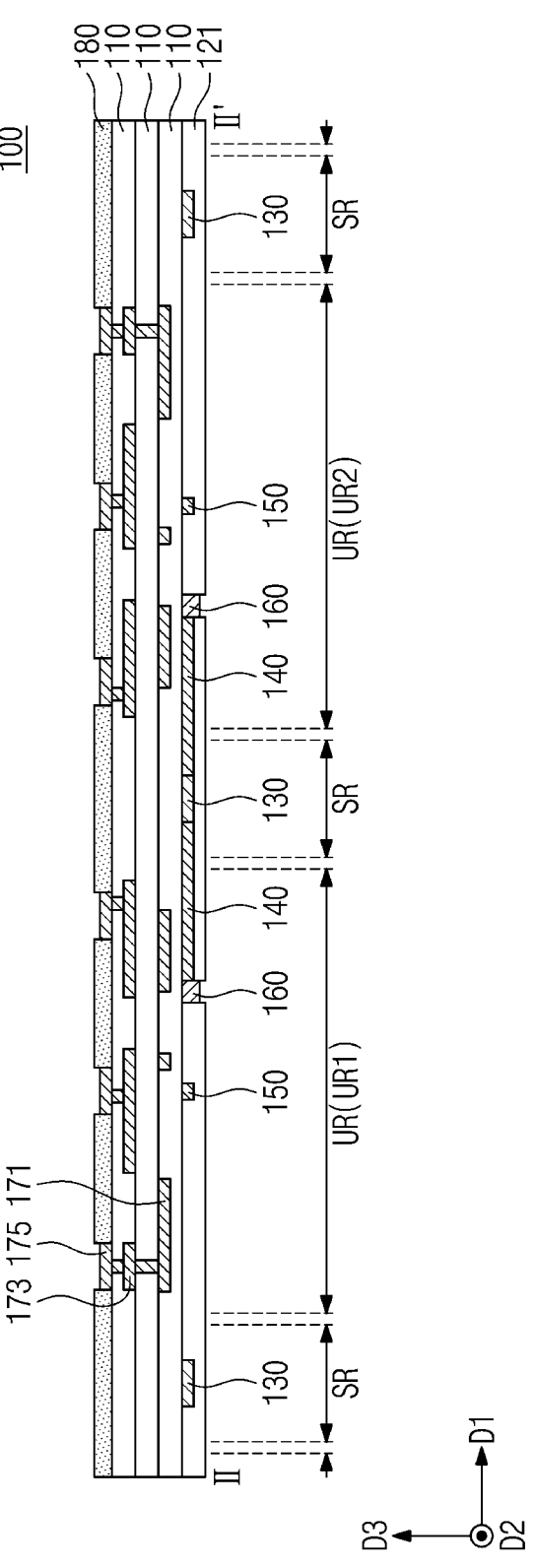
FIG. 4 illustrates a cross-sectional view taken along line II-II' of FIG. 2.

FIG. 1 illustrates a plan view showing a strip substrate according to some embodiments of the present disclosure. FIG. 2 illustrates an enlarged view showing section A of FIG. 1. FIG. 3 illustrates a cross-sectional view taken along line I-I' of FIG. 2. FIG. 4 illustrates a cross-sectional view taken along line II-II' of FIG. 2. FIGS. 5 to 8 illustrate enlarged views section B of FIG. 2.

Referring to FIGS. 1 to 4, a strip substrate 100 is shown and may include a dielectric layer 110, a saw line pattern 130, solder pads 160, wiring patterns 150, conductive dummy patterns 140, a dielectric protection layer 121, and power/ground patterns 123.

As shown in FIGS. 1 and 2, the dielectric layer 110 may have unit regions UR and a saw line region SR. The unit regions UR may be spaced apart from each other in a first direction D1 and a second direction D2. For example, the unit regions UR may be arranged in rows in the first direction D1 and in columns in the second direction D2. The first direction D1 may be parallel to a bottom surface of the dielectric layer 110. The second direction D2 may be parallel to the bottom surface of the dielectric layer 110 and intersect the first direction D1. A third direction D3 may be substantially perpendicular to the bottom surface of the dielectric layer 110 and intersect the first and second directions D1 and D2.

Each of the unit regions UR may be a region corresponding to a semiconductor package substrate. As shown in FIG. 2, the unit regions UR may include a first unit region UR1 and a second unit region UR2. The first unit region UR1 and the second unit region UR2 may be proximate to (e.g., adjacent and/or near) each other. The second unit region UR2 may be spaced apart from the first unit region UR1 in the first direction D1. The dielectric layer 110 may include a plurality of the first unit regions UR1, and the plurality of first unit regions UR1 may be arranged in columns. The first unit regions UR1 may be spaced apart from each other in the second direction D2. The dielectric layer 110 may include a plurality of the second unit regions UR2, and the plurality of second unit regions UR2 may be arranged in columns. The second unit regions UR2 may be spaced apart from each other in the second direction D2. For brevity of description, the following will discuss a single first unit region UR1 and a single second unit region UR2 that is proximate to the first unit region UR1.

The saw line region SR may surround, for example, each of the unit regions UR. A portion of the saw line region SR may be between the unit regions UR. The saw line region SR may be removed during a sawing process discussed below with reference to FIGS. 9 to 12. The saw line region SR may include first saw line regions SR1 and second saw line regions SR2.

The first saw line regions SR1 may extend in the first direction D1. The first saw line regions SR1 may be spaced apart from each other in the second direction D2. The second saw line regions SR2 may extend in the second direction D2. The second saw line regions SR2 may be spaced apart from each other in the first direction D1. The second saw line regions SR2 may be connected to the first saw line regions SR1. At least one of the second saw line regions SR2 may be provided between the first unit region UR1 and the second unit region UR2.

The saw line pattern 130 may be on the saw line region SR of the dielectric layer 110. The saw line pattern 130 may include first saw line patterns 131 and second saw line patterns 132.

The first saw line patterns 131 may be on the first saw line regions SR1. Each of the first saw line patterns 131 may have a major axis parallel to the first direction D1. The first saw line patterns 131 may be spaced apart from each other in the second direction D2. A length of the first saw line patterns 131 in the first direction D1 may be less than or equal to a length of the first saw line regions SR1 in the first direction D1. A width of the first saw line patterns 131 in the second direction D2 may be less than or equal to a width of the first saw line regions SR1 in the second direction D2.

The second saw line patterns 132 may be on the second saw line regions SR2. Each of the second saw line patterns 132 may have a major axis parallel to the second direction D2. The second saw line patterns 132 may be spaced apart from each other in the first direction D1. A length of the second saw line patterns 132 in the second direction D2 may be less than or equal to a length of the second saw line regions SR2 in the second direction D2. A width of the second saw line patterns 132 in the first direction D1 may be less than or equal to a width of the second saw line regions SR2 in the second direction.

The first saw line patterns 131 and the second saw line patterns 132 may include the same material. For example, the first saw line patterns 131 and the second saw line patterns 132 may include a metallic material, such as copper (Cu).

Although not shown, the saw line pattern 130 may further include marker patterns. The marker patterns may be provided on intersections between the first saw line patterns 131 and the second saw line patterns 132. The marker patterns may have a cross shape in a plan view. The marker patterns may be connected to the first saw line patterns 131 and the second saw line patterns 132. The marker patterns may include the same material as the first and second saw line patterns 131 and 132. For example, the marker patterns may include a metallic material, such as copper (Cu).

The solder pads 160 may be on the unit regions UR of the dielectric layer 110. The solder pads 160 may be laterally spaced apart from the saw line pattern 130. As used herein, the expression "laterally" may refer to the first direction D1, a direction opposite to the first direction D1, the second direction D2, or a direction opposite to the second direction D2. FIG. 2 depicts solder pads 160 that are arbitrarily arranged, but the present disclosure is not limited thereto. The solder pads 160 may include a metallic material, such as copper (Cu), gold (Au), nickel (Ni), and/or an alloy thereof.

The wiring patterns 150 may be on the unit regions UR of the dielectric layer 110. The wiring patterns 150 may not be on the saw line region SR. The wiring patterns 150 may be laterally spaced apart from the saw line pattern 130. The wiring patterns 150 may be connected to corresponding solder pads 160. Although the wiring patterns 150 are illustrated separately from the solder pads 160 connected thereto, each of the wiring patterns 150 and its corresponding solder pad 160 may be directly connected to each other with no visible interface therebetween. The wiring patterns 150 may include wiring line parts 153 and via pad parts 151. The wiring line parts 153 of the wiring patterns 150 may be between the solder pads 160 and the via pad parts 151.

The solder pads 160 may be connected to the via pad parts 151 through the wiring line parts 153. The wiring line parts 153 may include the same material as the via pad parts 151. Each of the wiring line parts 153 may be directly connected to the corresponding via pad part 151 with no visible interface therebetween. The wiring patterns 150 may include a metallic material, such as copper (Cu).

The conductive dummy patterns 140 may be on the unit regions UR of the dielectric layer 110. On one of the unit regions UR, each of the conductive dummy patterns 140 may be connected to a corresponding solder pad 160 and a corresponding wiring pattern 150. For example, one of the conductive dummy patterns 140 may be directly connected to a corresponding solder pad 160. The given conductive dummy pattern 140 may be connected to a corresponding wiring pattern 150 through the corresponding solder pad 160. Another conductive dummy pattern 140 may be connected to the solder pad 160 through the wiring pattern 150.

Each of the conductive dummy patterns 140 may be between the saw line region SR and the solder pad 160 that is connected to the each of the conductive dummy patterns 140. Each of the conductive dummy patterns 140 may be between the saw line region SR and the wiring pattern 150 that is connected to the each of the conductive dummy patterns 140. The conductive dummy patterns 140 may include a metallic material, such as copper (Cu). The conductive dummy pattern 150 may not be electrically connected to the power/ground patterns 123 in some embodiments.

The conductive dummy patterns 140 may be plating bars in some embodiments. For example, each of the conductive dummy patterns 140 may extend on either the saw line SR adjacent thereto from either the solder pad 160 or the wiring pattern 150. As another example, each of the conductive dummy patterns 140 may extend toward an adjacent one of the second saw line patterns 132 from either the solder pad 160 or the wiring pattern 150. The second saw line patterns 132 may be connected to the solder pad 160 or the wiring pattern 150 through the conductive dummy patterns 140. The conductive dummy patterns 140 may not connect the solder pads 160 and metal pads 175, as will be discussed below. The following will discuss a single conductive dummy pattern 140.

The power/ground patterns 123 may be on the unit regions UR of the dielectric layer 110. The power/ground patterns 123 may not be on the saw line region SR. The power/ground pattern 123 may be laterally spaced apart from the saw line pattern 130. In the unit regions UR, the power/ground patterns 123 may be adjacent to the saw line region SR. For example, each of the power/ground patterns 123 may be adjacent to one of the second saw line regions SR2. Each of the power/ground patterns 123 may be spaced apart at a first distance from the second saw line pattern 132 provided in the second saw line region SR2. The first distance may range from about 50 micrometers to about 150 micrometers. The first distance may be measured in the first direction D1.

The power/ground patterns 123 adjacent to the one of the second saw line regions SR2 may be spaced apart from each other in the second direction D2. For example, the power/ ground patterns 123 may be arranged on one side in the second direction D2 or opposite sides in the first direction D1 of the second saw line regions SR2. The power/ground patterns 123 may be connected to a power circuit or a ground circuit provided in the strip substrate 100. The power/ground patterns 123 may include a metallic material, such as copper (Cu).

At least one of the conductive dummy patterns 140 may be provided between adjacent power/ground patterns 123. For convenience of description, the adjacent power/ground patterns 123 will be referred to herein as "a first power/ ground pattern 124 and a second power/ground pattern 125," which are illustrated in FIGS. 5 to 8. The first power/ground pattern 124 and the second power/ground pattern 125 may be spaced apart from each other in the second direction D2. A distance between the first power/ground pattern 124 and the second power/ground pattern 125 may range from about 20 micrometers to about 150 micrometers.

The conductive dummy pattern 140 may extend from the solder pad 160 or the wiring pattern 150 and between the first and second power/ground patterns 124 and 125 and is thereby connected to one of the second saw line patterns 132. Each of the first and second power/ground patterns 124 and 125 may be spaced apart at a second distance L2 from the conductive dummy pattern 140 in the second direction D2. The second distance L2 may range from about 10 micrometers to about 30 micrometers.

The power/ground patterns 123 may include a metal plate pattern. For example, the power/ground patterns 123 may have a plate shape. The power/ground patterns 123 may have a width or area greater than the conductive dummy patterns 140. One or more corners of the power/ground patterns 123 may have a chamfer shape. A planar shape and arrangement of the power/ground patterns 123 will be discussed in detail below with reference to FIGS. 5 to 8. The following will describe the first power/ground pattern 124, the second power/ground pattern 125, and one conductive dummy pattern 142 that extends between the first and second power/ground patterns 124 and 125.

Figure 5:
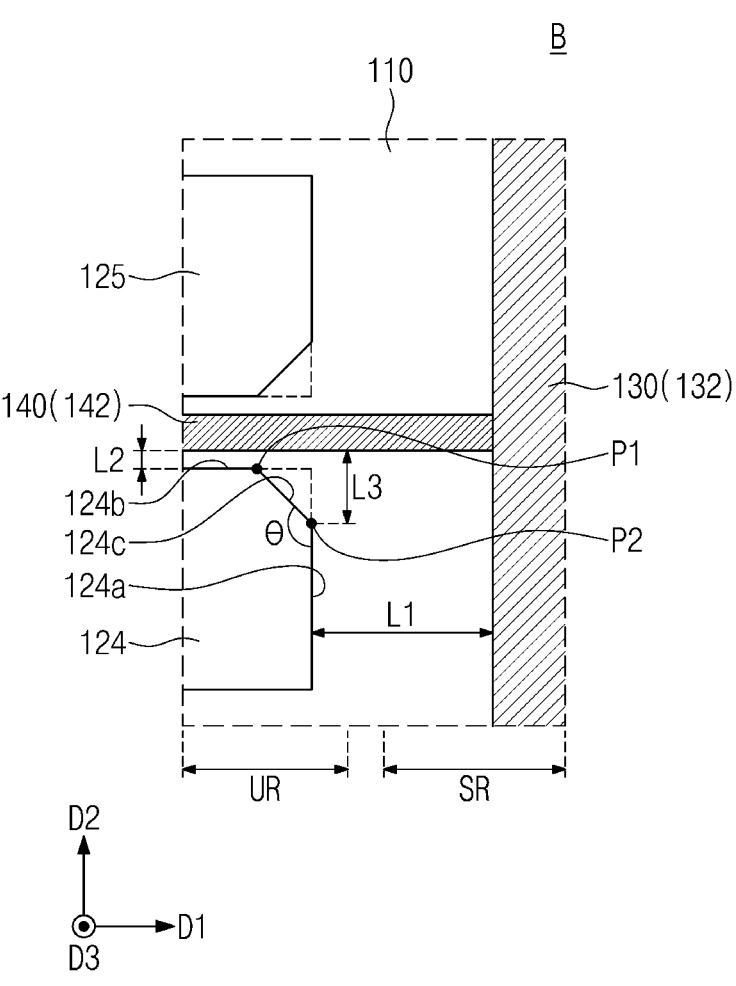
FIGS. 5, 6, 7, and 8 illustrate enlarged views section B of FIG. 2.

Referring to FIG. 5, the first power/ground pattern 124 may have a first lateral surface 124a, a second lateral surface 124b, and a third lateral surface 124c between the first lateral surface 124a and the second lateral surface 124b.

The first lateral surface 124a may be a lateral surface proximate to the second saw line pattern 132. The first lateral surface 124a may face the second saw line pattern 132. The first lateral surface 124a may extend along the second saw line pattern 132. For example, the first lateral surface 124*a* may extend in the second direction D2. A first interval, which may correspond to the first distance L1 in the first direction D1, between the first lateral surface 124*a* and the second saw line pattern 132 may range from about 50 micrometers to about 150 micrometers.

The second lateral surface 124*b* may be a lateral surface proximate to the conductive dummy pattern 142. The second lateral surface 124*b* may face the conductive dummy pattern 142. The second lateral surface 124*b* may extend along the conductive dummy pattern 142. For example, the second lateral surface 124*b* may extend in the first direction D1. A second interval, which may correspond to the second distance L2 in the second direction D2, between the second lateral surface 124*b* and the conductive dummy pattern 142 may range from about 10 micrometers to about 30 micrometers.

The third lateral surface 124*c* may be positioned between the first lateral surface 124*a* and the second lateral surface 124*b*. For example, the third lateral surface 124*c* may be a lateral surface proximate to an intersection between the second saw line pattern 132 and the conductive dummy pattern 142. The third lateral surface 124*c* may connect the first lateral surface 124*a* and the second lateral surface 124*b* to each other. The third lateral surface 124*c* may be a substantially flat surface. The third lateral surface 124*c* may be inclined to the first lateral surface 124*a* and the second lateral surface 124*b*. An angle θ made between the third lateral surface 124*c* and the first lateral surface 124*a* may range from about 120 degrees to about 150 degrees. An angle made between the third lateral surface 124*c* and the second lateral surface 124*b* may range from about 120 degrees to about 150 degrees.

A distance between the third lateral surface 124*c* and the conductive dummy pattern 142 (i.e., a third distance L3) may decrease as the distance between the third lateral surface 124*c* and the second saw line pattern 132 increases. The third distance L3 may be a distance in the second direction D2 from one point of the third lateral surface 124*c* to the conductive dummy pattern 142. The third distance L3 may be about one times to about two times greater than the second distance L2. For example, at a first point P1 where the third lateral surface 124*c* and the second lateral surface 124*b* contact each other, the third distance L3 may be the same as the second distance L2. At a second point P2 where the third lateral surface 124*c* and the first lateral surface 124*a* contact each other, the third distance L3 may be about two times greater than the second distance L2. The present disclosure, however, is not limited thereto. According to some embodiments, the third distance L3 at the second point P2 may be about 1.5 times to about 3 times the second distance L2. A shape of the third lateral surface 124*c* inclined to the first lateral surface 124*a* and the second lateral surface 124*b* may correspond to a chamfer at a corner of the power/ground patterns 123 that is directed toward the intersection between the second saw line pattern 132 and the conductive dummy pattern 142.

The first power/ground pattern 124 may include a first part adjacent to the second saw line pattern 132 and a second part connected to one side of the first part. The first part may be between the second part and the second saw line pattern 132. The first and third lateral surfaces 124*a* and 124*c* may be lateral surfaces of the first part. The second lateral surface 124*b* may be a lateral surface of the second part.

The distance between the second part and the conductive dummy pattern 142 may be constant in the second direction D2. For example, the second lateral surface 124*b* of the second part may extend along the conductive dummy pattern 142. A distance between the first part and the conductive dummy pattern 142 may increase in the first direction D1 as the distance between the first part and the saw line region SR or the second saw line pattern 132 decreases in the second direction D2. For example, the third lateral surface 124*c* of the first part may be farther away from the conductive dummy pattern 142 in the first direction D1 as the distance between the third lateral surface 124*c* the saw line region SR or the second saw line pattern 132 decreases in the second direction D2. The distance between the first part and the conductive dummy pattern 142 may be greater than the distance between the second part and the conductive dummy pattern 142.

FIG. 5 depicts that the third lateral surface 124*c* is a flat surface, but the present disclosure is not limited thereto.

Figure 6:
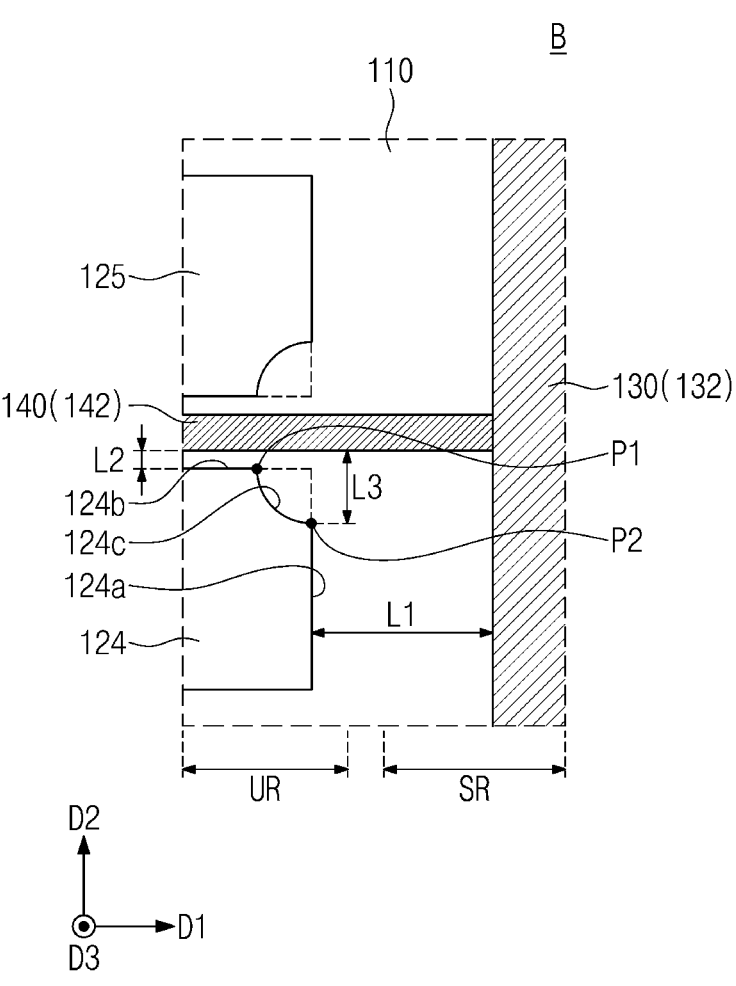

Referring to FIG. 6, the third lateral surface 124*c* may connect the first lateral surface 124*a* and the second lateral surface 124*b* to each other. The third lateral surface 124*c* may be a curved surface. For example, in a plan view, the third lateral surface 124*c* may be a concave surface that is concave toward an inside of the first power/ground pattern 124. Moreover, the third distance L3 between the third lateral surface 124*c* and the second saw line pattern 132 may decrease as the distance between the third lateral surface 124*c* and the second saw line pattern 132 increases. The third distance L3 may be one times to two times greater than the second distance L2.

As another example, the third lateral surface 124*c* may be a convex surface that is convex in a direction away from an inside of the first power/ground pattern 124. In this example embodiment, the third distance L3 between the third lateral surface 124*c* and the second saw line pattern 132 may decrease as the distance between the third lateral surface 124*c* and the second saw line pattern 132 increases. The third distance L3 may be one times to two times greater than the second distance L2.

FIGS. 5 and 6 depict that the first lateral surface 124*a* and the second lateral surface 124*b* are provided therebetween with one continuous surface or the third lateral surface 124*c*, but the present disclosure is not limited thereto.

Figure 7:
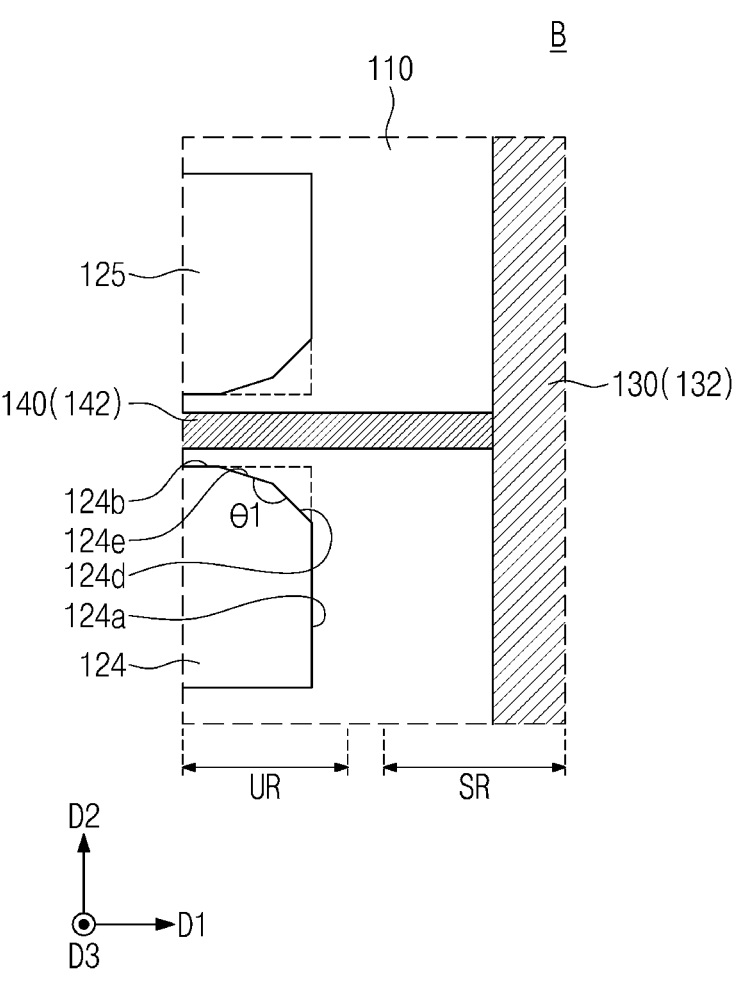

Referring to FIG. 7, the first power/ground pattern 124 may have the first lateral surface 124*a*, the second lateral surface 124*b*, a fourth lateral surface 124*d* between the first lateral surface 124*a* and the second lateral surface 124*b*, and a fifth lateral surface 124*e* between the first lateral surface 124*a* and the second lateral surface 124*b*.

The fourth lateral surface 124*d* may be connected to the first lateral surface 124*a*. The fourth lateral surface 124*d* may be a substantially flat surface. The fourth lateral surface 124*d* may be inclined to the first lateral surface 124*a*. An angle between the fourth lateral surface 124*d* and the first lateral surface 124*a* may range from about 120 degrees to about 150 degrees. An angle θ1 between the fourth lateral surface 124*d* and the fifth lateral surface 124*e* may range from about 90 degrees to about 120 degrees. A distance between the fourth lateral surface 124*d* and the conductive dummy pattern 142 may increase as the distance between the fourth lateral surface 124*d* and the second saw line pattern 132 decreases.

The first power/ground pattern 124 may include a first part adjacent to the second saw line pattern 132, a second part connected to one side of the first part, and a third part between the first part and the second part. The second lateral surface 124*b* may be a lateral surface of the second part. The fourth lateral surface 124*d* may be a lateral surface of the first part. The fifth lateral surface 124e may be a lateral surface of the third part 124-3.

The distance between the second part and the conductive dummy pattern 142 may be constant in the second direction D1. A distance between the third part and the conductive dummy pattern 142 may increase in the second direction D2 as the distance between the third part and the saw line region SR or the second saw line pattern 132 decreases in the first direction D1. A distance between the first part and the conductive dummy pattern 142 may increase in the second direction D2 as the distance between the first part and the saw line region SR or the second saw line pattern 132 decreases in the first direction D1. The distance between the third part and the conductive dummy pattern 142 may be greater than the distance between the second part and the conductive dummy pattern 142. The distance between the first part and the conductive dummy pattern 142 may be greater than between the third part and the conductive dummy pattern 142.

FIG. 7 depicts that the angle θ1 made between the fourth lateral surface 124d and the fifth lateral surface 124e is less than about 180 degrees, but the present disclosure is not limited thereto.

Figure 8:
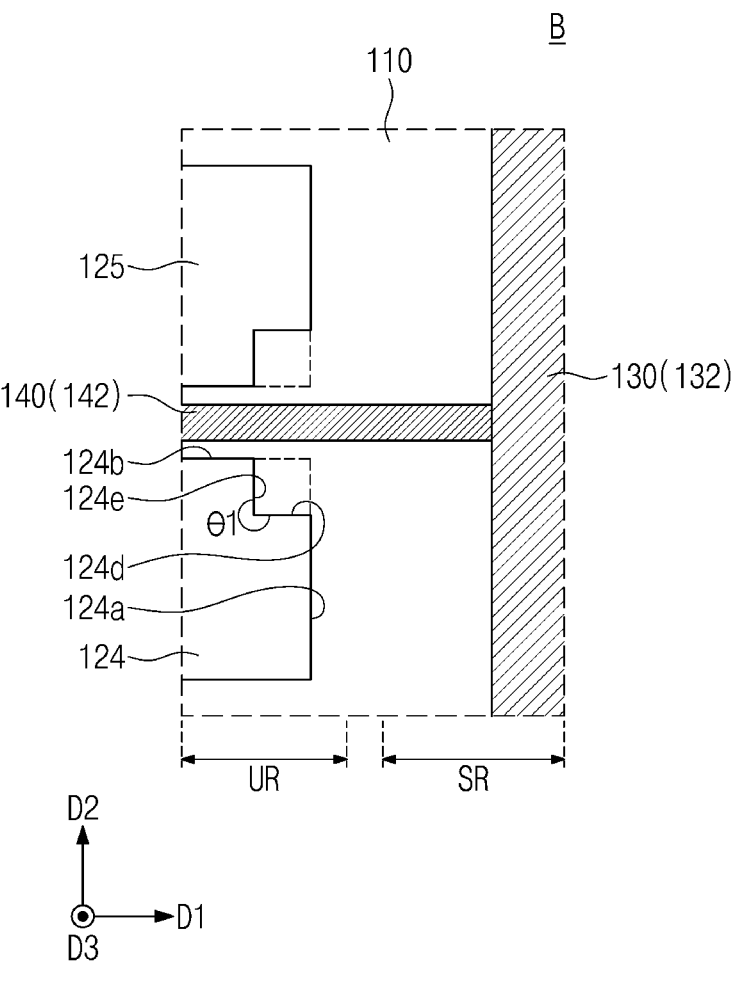

Referring to FIG. 8, an angle θ1 made between the fourth lateral surface 124d and the fifth lateral surface 124e may be greater than about 180 degrees. For example, as shown in FIG. 8, the angle θ1 made between the fourth lateral surface 124d and the fifth lateral surface 124e may be about 270 degrees. In this case, the fourth lateral surface 124d may be parallel to the second lateral surface 124b, and the fifth lateral surface 124e may be parallel to the first lateral surface 124a. According to some embodiments, the angle θ1 made between the fourth lateral surface 124d and the fifth lateral surface 124e may range from about 180 degrees to about 270 degrees.

A planar shape and arrangement of the second power/ground pattern 125 may be similar to that of the first power/ground pattern 124.

Referring to FIGS. 5 and 6, the second power/ground pattern 125 may have a sixth lateral surface 126a, a seventh lateral surface 126b, and an eighth lateral surface 126c between the sixth lateral surface 126a and the seventh lateral surface 126b.

The sixth lateral surface 126a may be a lateral surface proximate to the second saw line pattern 132. The sixth lateral surface 126a may extend along the second saw line pattern 132. A distance between the sixth lateral surface 126a and the second saw line pattern 132 may range from about 50 micrometers to about 150 micrometers.

The seventh lateral surface 126b may be a lateral surface most adjacent to the conductive dummy pattern 142. The seventh lateral surface 126b may extend along the conductive dummy pattern 142. A distance between the seventh lateral surface 126b and the conductive dummy pattern 142 may range from about 10 micrometers to about 30 micrometers.

The eighth lateral surface 126c may be between the sixth lateral surface 126a and the seventh lateral surface 126b. For example, the eighth lateral surface 126c may be a lateral surface proximate to an intersection between the second saw line pattern 132 and the conductive dummy pattern 142. The eighth lateral surface 126c may be either a substantially flat surface as shown in FIG. 5 or a concave surface that is concave toward an inside of the second power/ground pattern 125 as shown in FIG. 6. The eighth lateral surface 126c may be inclined to the sixth lateral surface 126a and the seventh lateral surface 126b. An angle ranging from about 120 degrees to about 150 degrees may be provided between the eighth lateral surface 126c and the sixth lateral surface 126a or between the eighth lateral surface 126c and the seventh lateral surface 126b. A distance between the eighth lateral surface 126c and the conductive dummy pattern 142 may increase as the distance between the eighth lateral surface 126c and the second saw line pattern 132 decreases. A distance between the eighth lateral surface 126c and the second saw line pattern 132 may be about one times to about two times a distance between the seventh lateral surface 126b and the conductive dummy pattern 142. A shape of the eighth lateral surface 126c inclined to the sixth lateral surface 126a and the seventh lateral surface 126b may correspond to that of a chamfer at a corner of the power/ground patterns 123 that is directed toward the intersection between the second saw line pattern 132 and the conductive dummy pattern 142.

According to some embodiments and referring to FIG. 7, the sixth lateral surface 126a and the seventh lateral surface 126b may be connected by a ninth lateral surface 126d and a tenth lateral surface 126e as opposed to the eighth lateral surface 126c. As shown in FIG. 7, the ninth lateral surface 126d and the tenth lateral surface 126e may be inclined at an angle ranging from about 90 degrees to about 120 degrees to the sixth lateral surface 126a and the seventh lateral surface 126b, respectively. Alternatively, as shown in FIG. 8, the ninth lateral surface 126d may be parallel to the seventh lateral surface 126b, and the tenth lateral surface 126e may be parallel to the sixth lateral surface 126a.

Referring back to FIGS. 1 to 4, the dielectric layer 110 may include a plurality of stacked dielectric layers. The plurality of dielectric layers 110 may include an inorganic material, such as glass fiber, or an organic material, such as epoxy resin.

The strip substrate 100 may further include via patterns 171, upper wiring patterns 173, and metal pads 175. The upper wiring patterns 173 may be between the dielectric layers 110. The via patterns 171 may be between the dielectric layers 110, and each of the via patterns 171 may be connected to at least one of the upper wiring patterns 173. The via patterns 171 in a lowermost dielectric layer 110 may be on and connected to the via pad parts 151 of the wiring patterns 150.

The metal pads 175 may be on a top surface of an uppermost dielectric layer 110. The metal pads 175 may be laterally spaced apart from and connected to each other. The metal pads 175 may be connected to the via patterns 171 in the upper dielectric layer 110. Therefore, the metal pads 175 may be connected to the solder pads 160 through the upper wiring patterns 173, the via patterns 171, and the wiring patterns 150.

On one of the unit regions UR of the dielectric layer 110, a pitch of the metal pads 175 may be different from that of the solder pads 160. For example, the pitch of the metal pads 175 may be less than that of the solder pads 160. The upper wiring patterns 173 and the via patterns 171 may include a metallic material, such as copper (Cu). The metal pads 175 may include a conductive material, such as copper (Cu), titanium (Ti), nickel (Ni), gold (Au), or an alloy thereof.

The strip substrate 100 may further include an upper protection layer 180. The upper protection layer 180 may be on the top surface of the uppermost dielectric layer 110 and may expose top surfaces of the metal pads 175. The upper protection layer 180 may further cover lateral surfaces of the metal pads 175. The upper protection layer 180 may include a dielectric material, such as a solder resist material. The solder resist material may include polymer or resin, but the present disclosure is not limited thereto.

The power/ground patterns 123, the conductive dummy patterns 140, the wiring patterns 150, the solder pads 160, and the saw line pattern 130 may be on a bottom surface of the lowermost dielectric layer 110. The conductive dummy patterns 140 may have their top surfaces located at substantially the same level (i.e., extend from the lowermost dielectric layer 110 in the third direction D3) as that of top surfaces of the power/ground patterns 123, top surfaces of the wiring patterns 150, top surfaces of the solder pads 160, and a top surface of the saw line pattern 130.

The conductive dummy patterns 140 may have a first thickness in the third direction D3. The first thickness may range from about 10 μm to about 20 μm. The thickness of the conductive dummy patterns 140 may be substantially the same as that of the wiring patterns 150 and that of the saw line pattern 130. As described herein, it should be understood that two components having the same thickness, level, width, or length may include an allowable tolerance that may occur during a fabrication process of the strip substrate 100.

The solder pads 160 may have a second thickness in the third direction D3. The second thickness may be greater than the first thickness, a thickness of the wiring patterns 150, and a thickness of the first saw line patterns 131. The solder pad 160 and at least one of the wiring pattern 150 and the conductive dummy pattern 140 may be directly connected. The solder pads 160 may include the same material as that of the saw line pattern 130, the conductive dummy patterns 140, and the wiring patterns 150. For example, the solder pads 160 may include a metallic material, such as copper (Cu). Alternatively, the solder pad 160 may be a multiple layer of metallic materials. The metallic material may include copper (Cu), nickel (Ni), or gold (Au).

The dielectric protection layer 121 may be provided on the bottom surface of the dielectric layer 110. For example, the dielectric protection layer 121 may be provided on the unit regions UR and the saw line region SR of the dielectric layer 110. The dielectric protection layer 121 may be on and/or cover the wiring patterns 150, the conductive dummy patterns 140, and the saw line pattern 130. The dielectric protection layer 121 may have pad openings 127. The pad openings 127 may expose the solder pads 160. The dielectric protection layer 121 may include a material the same as or different from that of the upper protection layer 180. The dielectric protection layer 121 may include, for example, a solder resist material.

When the saw line pattern 130 has marker patterns, the dielectric protection layer 121 may further have marker openings that expose the marker patterns.

FIGS. 2 to 8 depict that the power/ground patterns 123 are proximate to and arranged along the second saw line patterns 132, and that the conductive dummy patterns 140 extend between the power/ground patterns 123 to thereby connect to the second saw line patterns 132, but the present disclosure is not limited thereto.

According to some embodiments, the power/ground patterns 123 may be proximate to and arranged along the first saw line patterns 131, and the conductive dummy patterns 140 may extend between the power/ground patterns 123 to thereby connect to the first saw line patterns 131. In this embodiment, the power/ground patterns 123 may have a chamfer shape at its corner proximate to an intersection between the conductive dummy patterns 140 and the first saw line patterns 131.

According to some embodiments, the power/ground patterns 123 may be proximate to and arranged along the first saw line patterns 131 and the second saw line patterns 132, and the conductive dummy patterns 140 may extend between the power/ground patterns 123 to thereby connect to the first saw line patterns 131 or the second saw line patterns 132. The power/ground patterns 123 proximate to the first saw line patterns 131 may have a chamfer shape at its corner proximate to an intersection between the conductive dummy patterns 140 and the first saw line patterns 131. The power/ground patterns 123 proximate to the second saw line patterns 132 may have a chamfer shape at its corner proximate to an intersection between the conductive dummy patterns 140 and the second saw line patterns 132.

Figure 9:
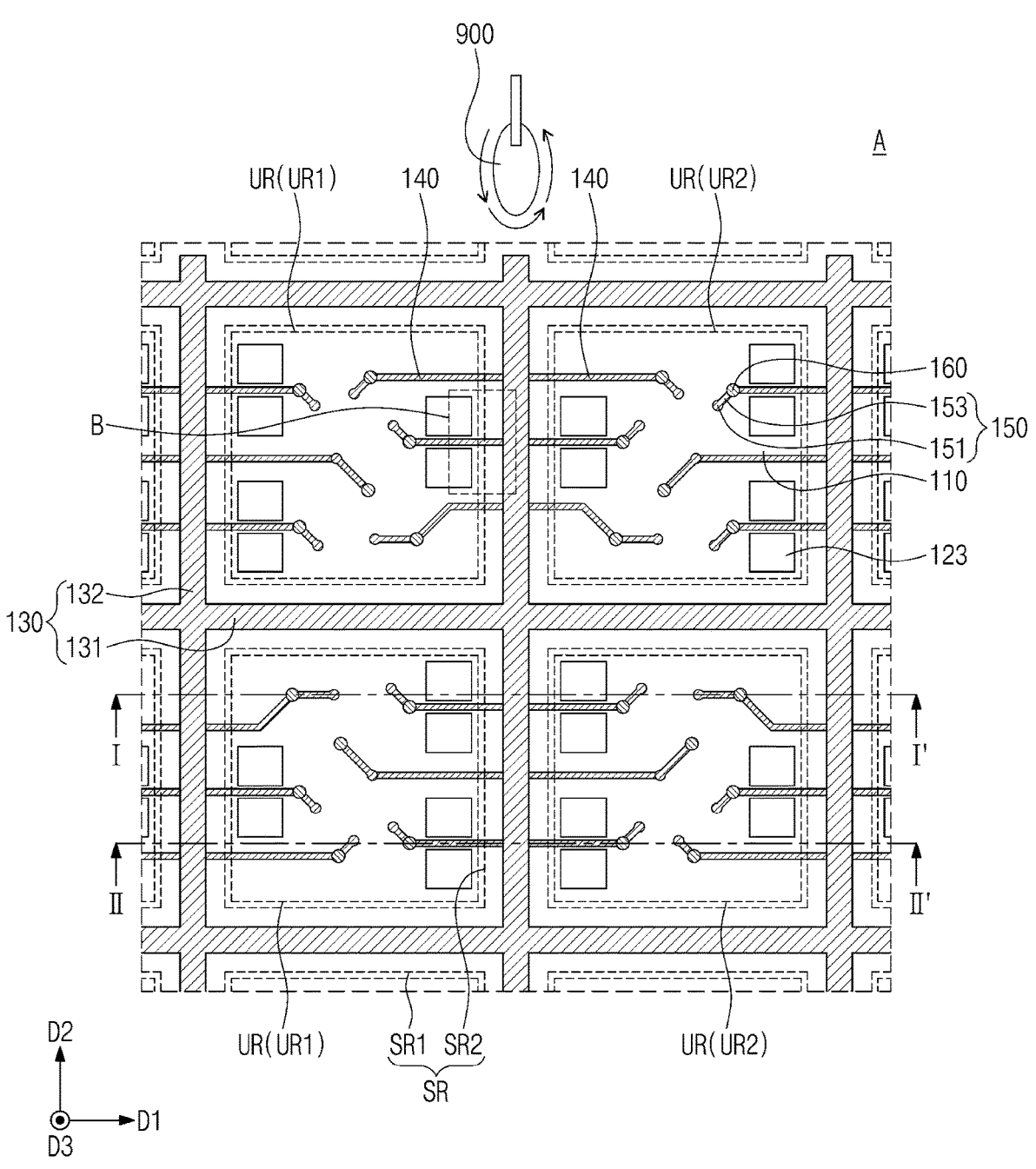
Figure 10:
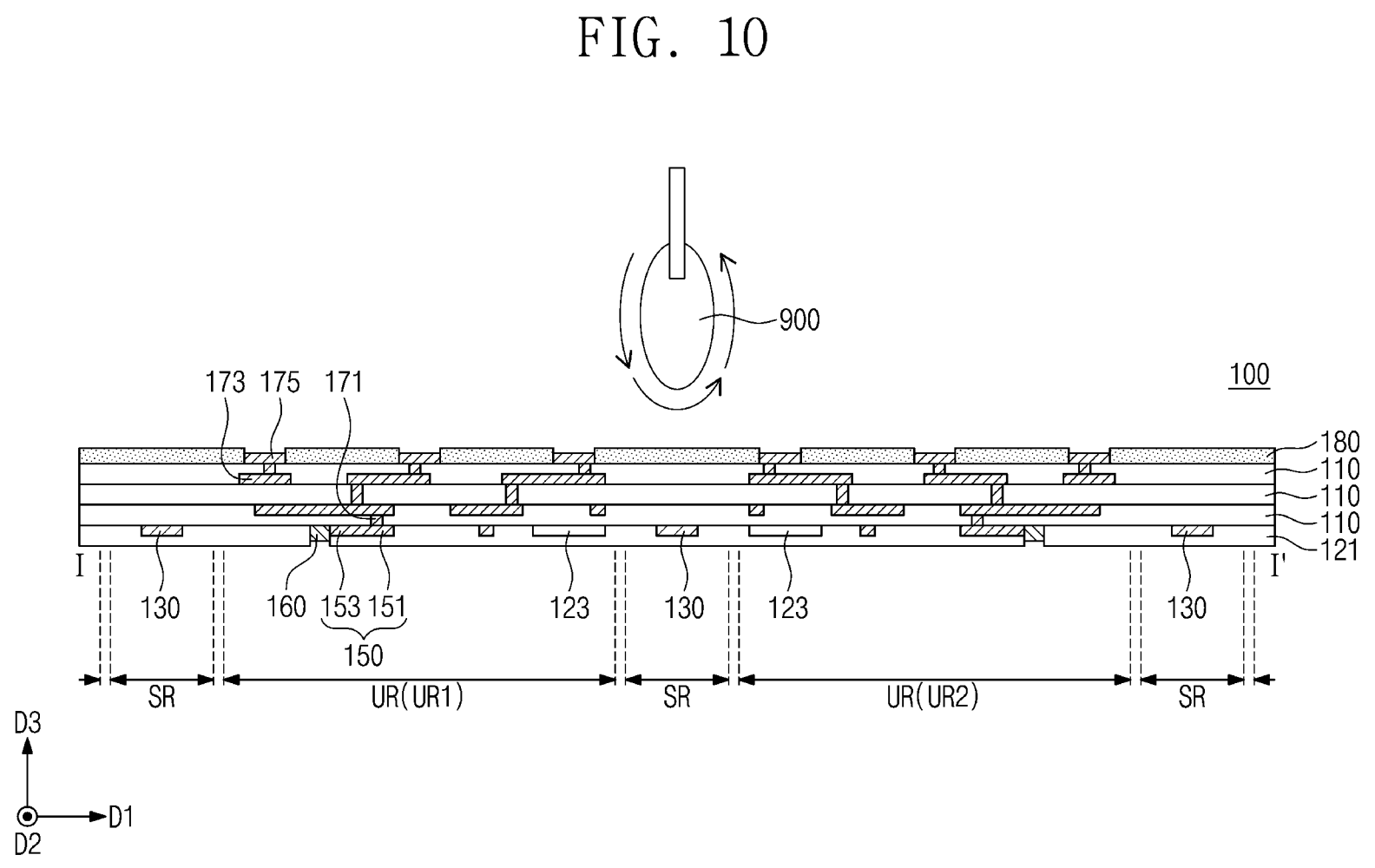
Figure 11:
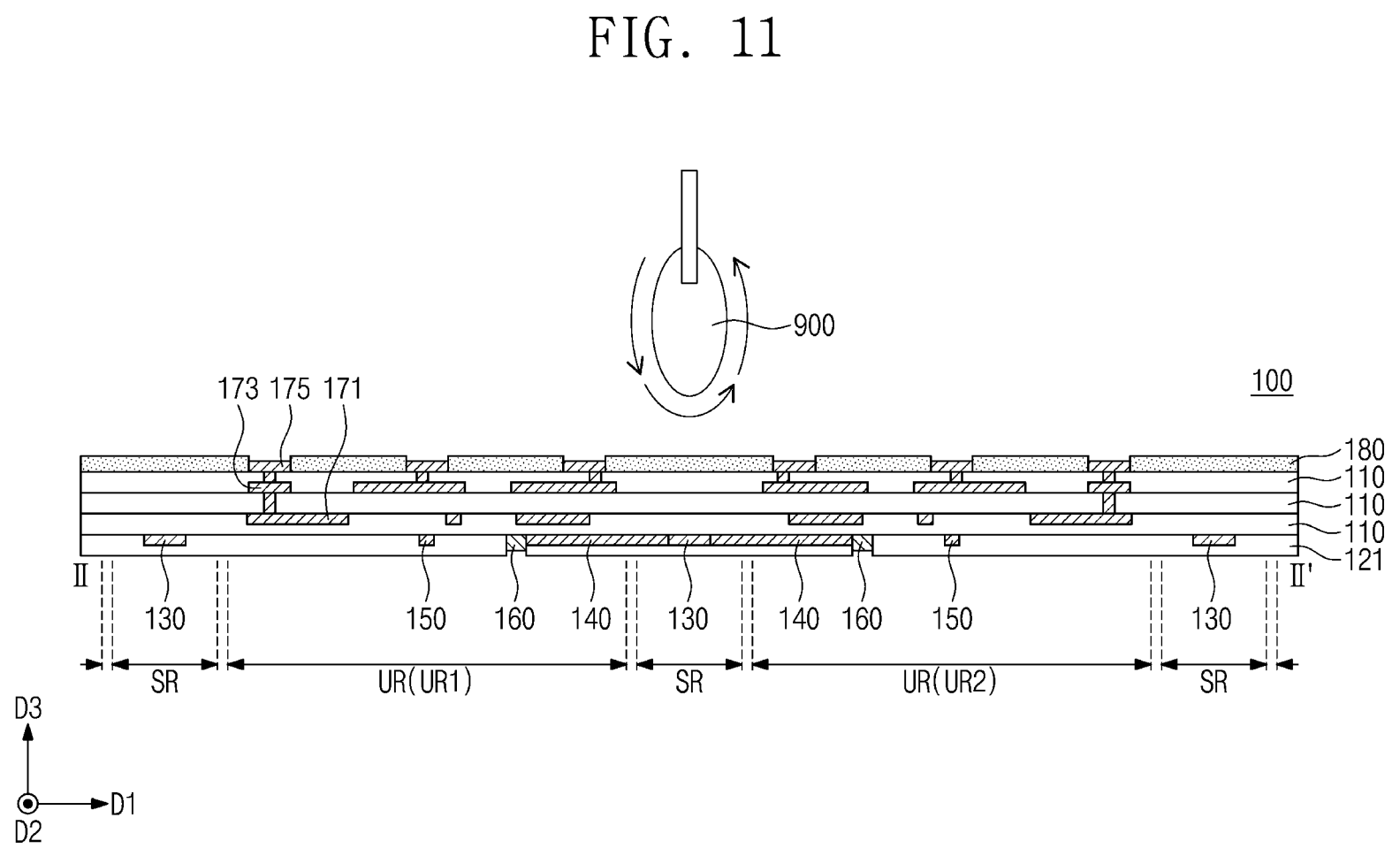
Figure 12:
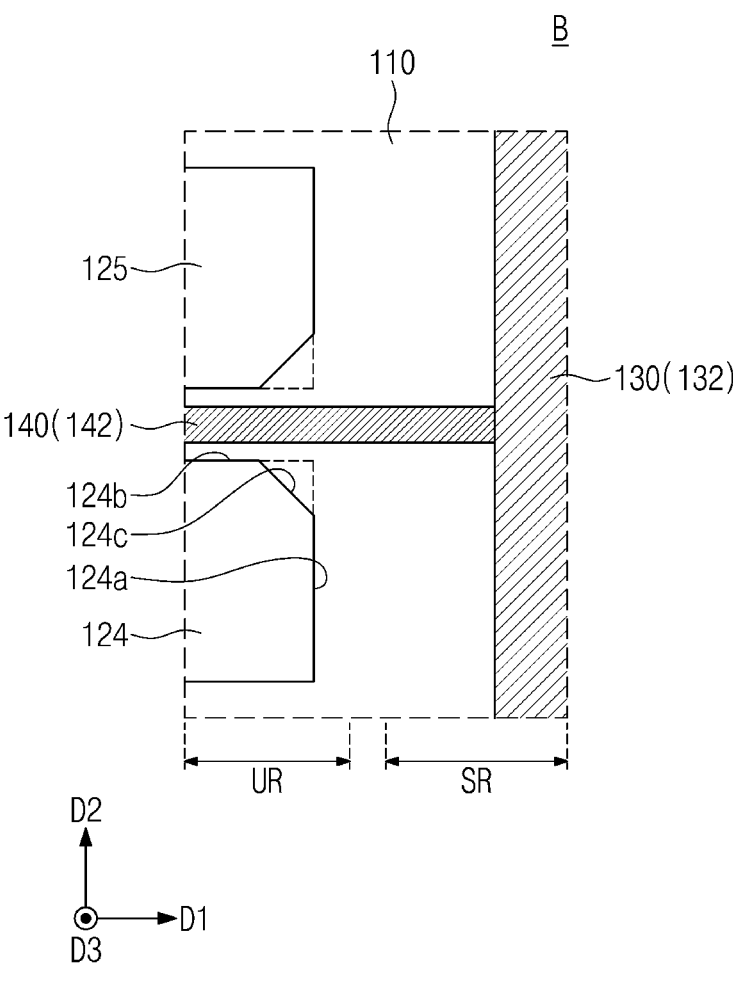
Figure 13:
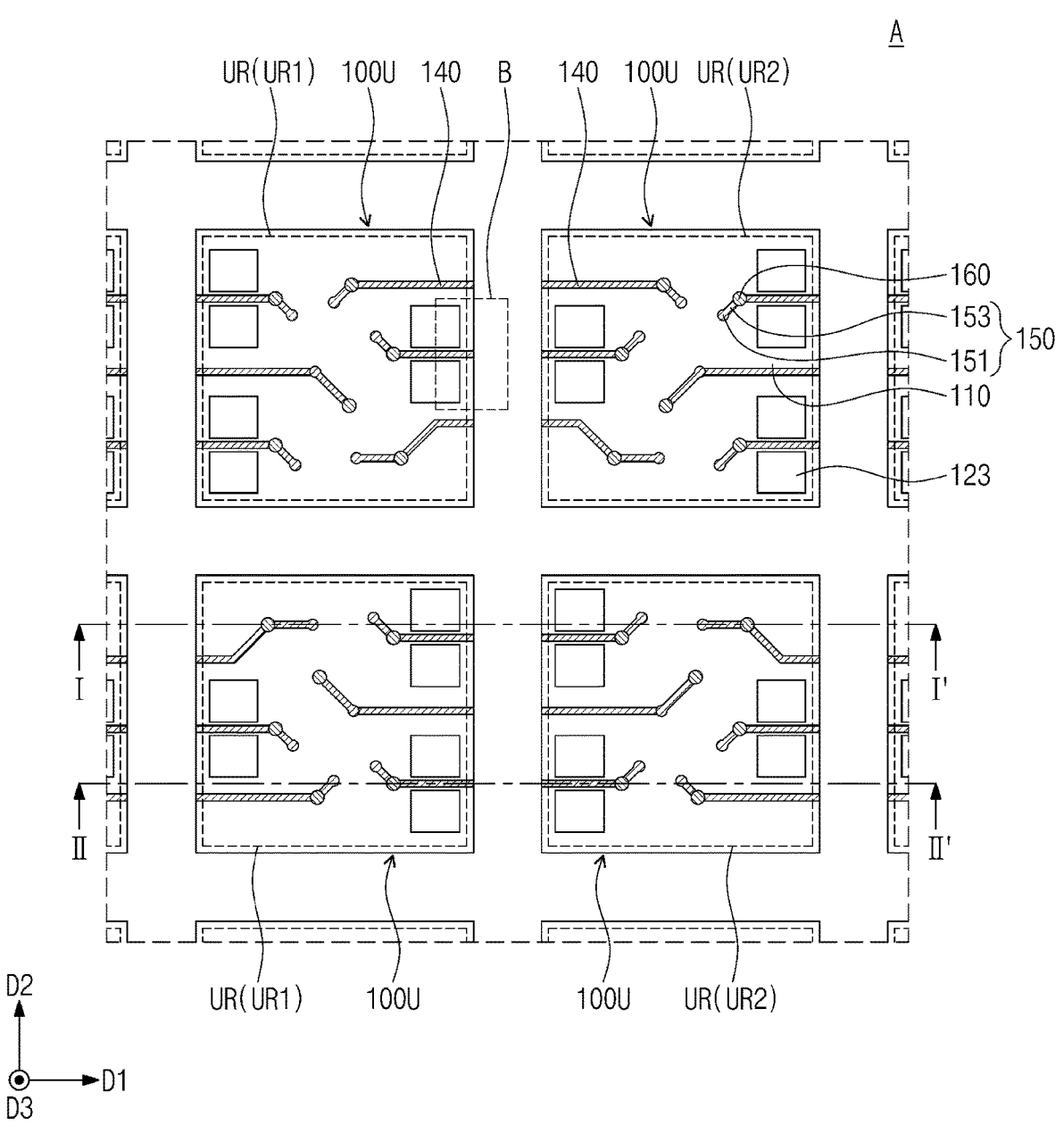
Figure 14:
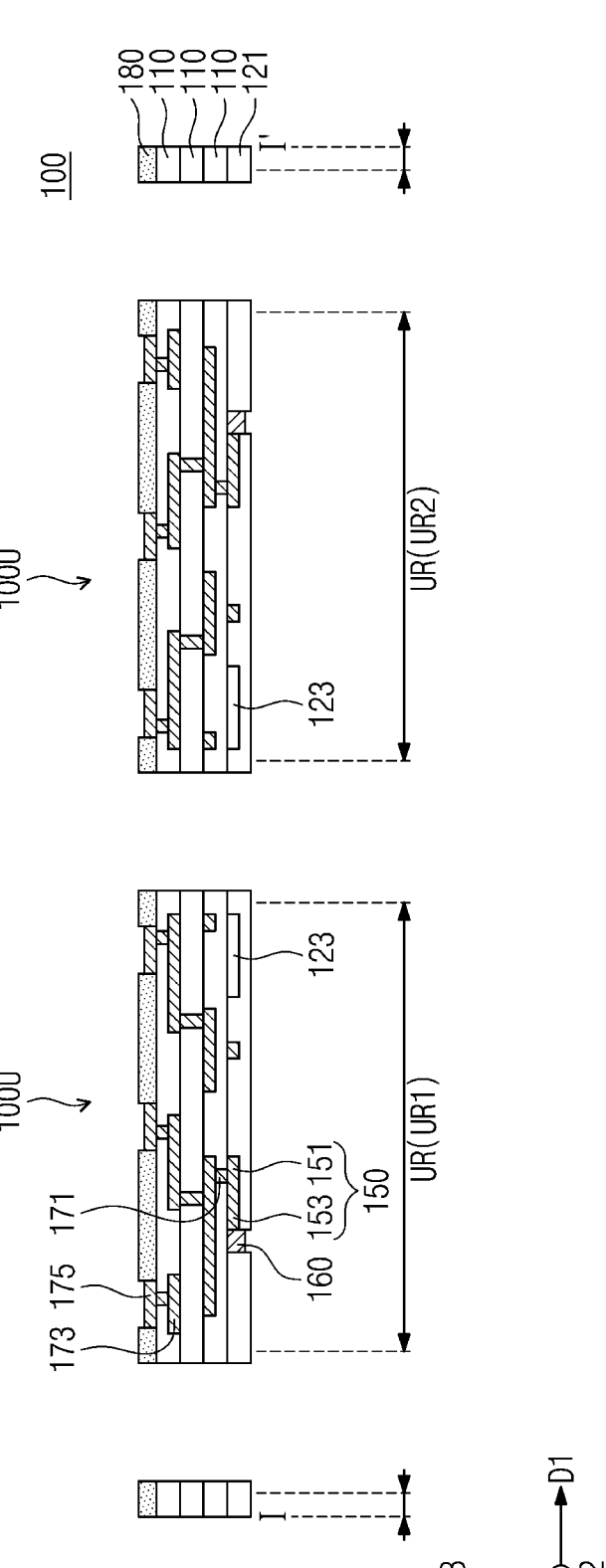
Figure 15:
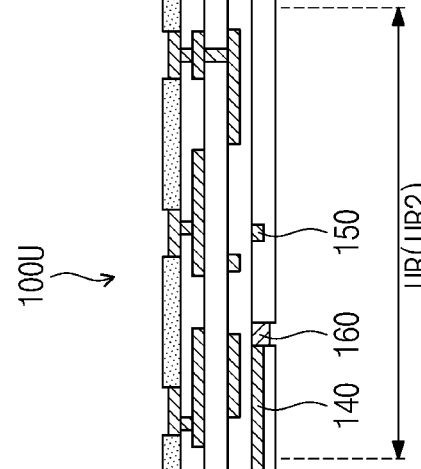
Figure 15:
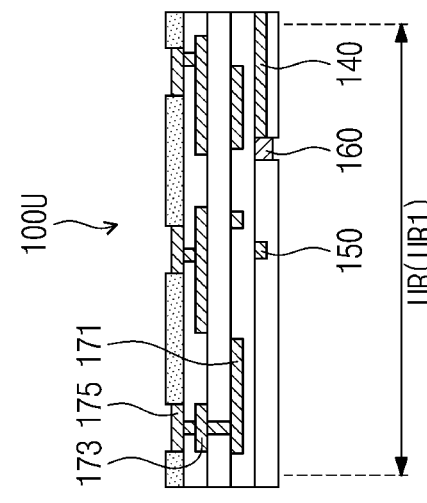
Figure 15:
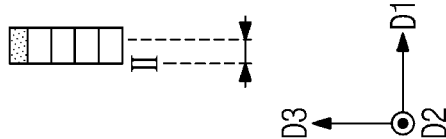
Figure 16:
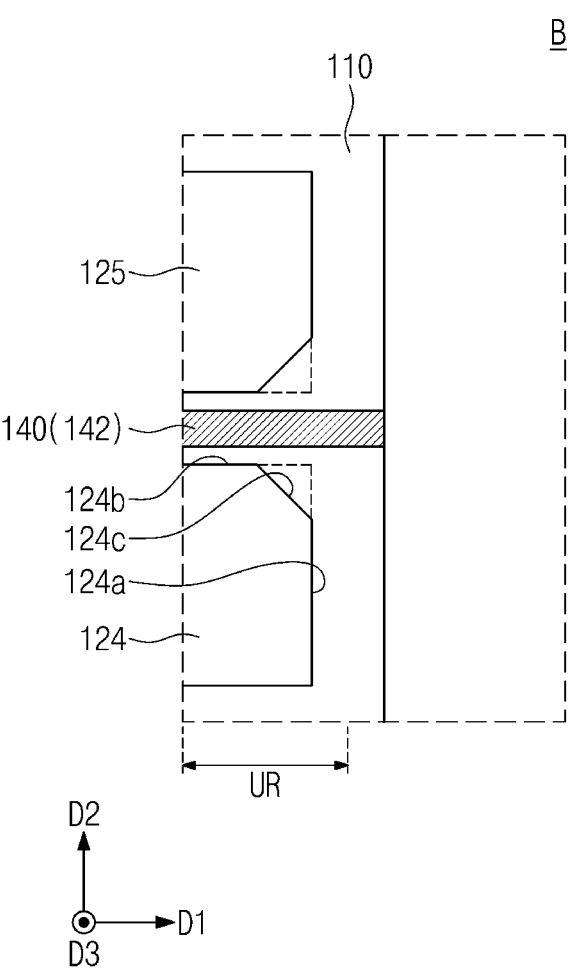

FIGS. 9 to 16 illustrate diagrams showing a sawing process for a strip substrate according to some embodiments of the present disclosure. FIGS. 9 and 13 illustrate plan views showing a sawing process for a strip substrate according to some embodiments of the present disclosure. FIGS. 10 and 14 illustrate cross-sectional views taken along line I-I' of FIGS. 9 and 13, respectively. FIGS. 11 and 15 illustrate cross-sectional views taken along line II-II' of FIGS. 9 and 13, respectively. FIGS. 12 and 16 illustrate enlarged views showing section B of FIGS. 9 and 13, respectively.

Referring to FIGS. 9 to 13, a strip substrate 100 may undergo a sawing process to form package substrates 100U. The strip substrate 100 may be substantially the same as that discussed above with reference to FIGS. 1 to 8. A blade 900 may be used to perform the sawing process for the strip substrate 100, but the present disclosure is not limited thereto. The sawing process may use the marker patterns to recognize the saw line region SR. Along the saw line region SR, the blade 900 may cut the dielectric protection layer 121, the saw line pattern 130, the conductive dummy patterns 140, the dielectric layer 110, and the upper protection layer 180. As a result of the sawing process, the saw line region SR of the dielectric layer 110 may be removed, and components on the saw line region SR may also be removed. For example, the sawing process may remove the saw line pattern 130, and may also remove the conductive dummy patterns 140, the dielectric protection layer 121, and the upper protection layer 180 on the saw line region SR. The power/ground patterns 123 may not be exposed to the sawing process. The sawing process may cause the unit regions UR of the dielectric layer 110 to separate from each other. According to some embodiments, a laser cutting process or an etching process may be performed as the sawing process for the strip substrate 100.

Referring to FIGS. 13 to 16, the sawing process may form a plurality of separated package substrates 100U. The package substrates 100U may correspond to the unit regions UR of the dielectric layer 110 of the strip substrate 100. Each of the package substrates 100U may include the dielectric protection layer 121, the stacked dielectric layers 110, the via patterns 171, the upper wiring patterns 173, the metal pads 175, the upper protection layer 180, the power/ground patterns 123, the solder pads 160, the wiring patterns 150, and the conductive dummy patterns 140. The via patterns 171, the upper wiring patterns 173, the metal pads 175, the upper protection layer 180, the power/ground patterns 123, the solder pads 160, the wiring patterns 150, and the conductive dummy patterns 140 in each package substrate 100U may be components on one unit region UR in the strip substrate 100. The package substrate 100U may not include the saw line pattern 130. The conductive dummy patterns 140 may be exposed on lateral surfaces of the package substrates 100U or lateral surfaces of the dielectric layers 110 that are revealed after the sawing process is performed.

The sawing process may cut the dielectric protection layer 121, the saw line pattern 130, the conductive dummy patterns 140, the dielectric layer 110, and the upper protection layer 180, and impurities may be created during the sawing process. The impurities may be byproducts of a cutting or etching process for the dielectric protection layer 121, the saw line pattern 130, the conductive dummy patterns 140, the dielectric layer 110, and the upper protection layer 180, or may be a chemical solution and the like used for the cutting or etching process. The impurities may be introduced into the package substrates 100U through the lateral surfaces of the package substrates 100U. For example, ends of the conductive dummy patterns 140 may be exposed on lateral surfaces of the dielectric layers 110, and the impurities may be introduced into the package substrates 100U and along the conductive dummy patterns 140.

According to some embodiments of the present disclosure, a corner of the power/ground patterns 123 may have a chamfer shape on an area proximate to the saw line region SR. For example, in the area proximate to the saw line region SR, a distance between the power/ground patterns 123 and the conductive dummy patterns 140 may increase as the distance between the power/ground patterns 123 and the saw line region SR decreases. Therefore, damage to the power/ground patterns 123 may be prevented due to the impurities that are introduced along the conductive dummy patterns 140 from the saw line region SR or cutting surfaces of the package substrates 100U in the sawing process. As such, the package substrates 100U may reduce or prevent occurrences of short-circuiting between the power/ground patterns 123 and the conductive dummy patterns 140. Accordingly, the present disclosure provides a method of fabricating a package substrate and a strip substrate with less occurrences of failure, a strip substrate with improved operating stability, a package substrate fabricated by using the strip substrate, and a semiconductor package including the package substrate.

In addition, the power/ground patterns 123 may have a chamfer shape at only a corner proximate to the saw line region SR, and a small distance may be provided between the power/ground patterns 123 on an area not proximate to the saw line region SR. Thus, transmission power reductions caused by an increase in distance between the power/ground patterns 123 of the package substrates 100U may be prevented.

The following will discuss a single wiring pattern 150 and a single solder pad 160.

The package substrate 100U may have a top surface, a bottom surface, and a sidewall. The sidewall of the package substrate 100U may connect an edge of the top surface to an edge of the bottom surface. The sidewall of the package substrate 100U may include outer sidewalls of the dielectric layers 110 and outer sidewalls of the conductive dummy patterns 140. The outer sidewalls of the conductive dummy patterns 140 may be vertically aligned with the outer sidewalls of the dielectric layers 110.

In a plan view, the conductive dummy pattern 140 may be interposed between the power/ground patterns 123. The conductive dummy pattern 140 may be connected to the solder pad 160 or the wiring pattern 150.

The power/ground patterns 123 may have sidewalls toward an outer sidewall of the package substrate 100U. The dielectric layers 110 may cover the sidewalls of the power/ ground patterns 123. Therefore, the power/ground patterns 123 may not be exposed on the sidewall of the package substrate 100U.

The dielectric layers 110, the upper wiring patterns 173, the via patterns 171, the metal pads 175, the upper protection layer 180, and the wiring patterns 150 may be substantially the same as those discussed above.

Figure 17:
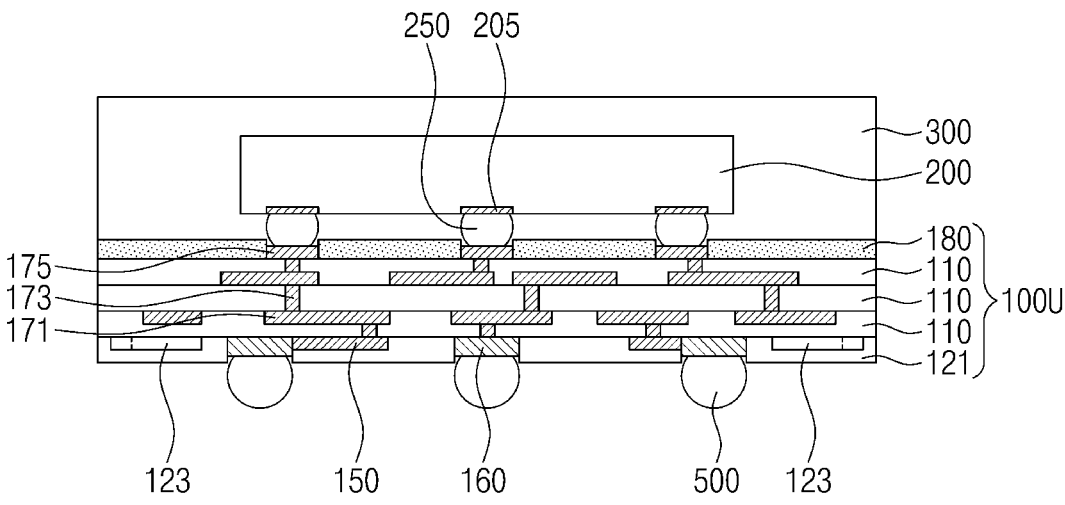
FIG. 17 illustrates a cross-sectional view showing a semiconductor package according to some embodiments of the present disclosure.

FIG. 17 illustrates a cross-sectional view showing a semiconductor package according to some embodiments of the present disclosure.

Referring to FIG. 17, a semiconductor package 1 may include a package substrate 100U, solder terminals 500, a semiconductor chip 200, and a molding layer 300. The package substrate 100U may be fabricated by sawing the strip substrate 100 as discussed in the examples of FIGS. 9 to 16.

The solder terminals 500 may be on a bottom surface of the package substrate 100U. For example, the solder terminals 500 may be on bottom surfaces of a plurality of solder pads 160. The solder terminals 500 may be connected to the metal pads 175 through the solder pads 160. The solder terminals 500 may be solder balls and may include metal, such as a solder material. The solder material may include one or more of tin (Sn), silver (Ag), zinc (Zn), and an alloy thereof.

The semiconductor chip 200 may be mounted on a top surface of the package substrate 100U. Bump patterns 250 may be formed between the metal pads 175 and chip pads 205 of the semiconductor chip 200 to thereby be connected to the chip pads 205 and the metal pads 175. Alternatively, the chip pads 205 may be provided on a top surface of the semiconductor chip 200, and the semiconductor chip 200 may be connected to the package substrate 100U through bonding wires (not shown).

FIG. 17 depicts that one semiconductor chip 200 is mounted on the package substrate 100U, but the present disclosure is not limited thereto. The package substrate 100U may be provided thereon with a plurality of semiconductor chips that are horizontally spaced apart from each other, a chip stack including a plurality of stacked semiconductor chips, an interposer substrate, an external connector, or a combination thereof.

Although not shown, an underfill layer may be provided in a gap between the package substrate 100U and the semiconductor chip 200, thereby encapsulating the bump patterns 250. The underfill layer may include a dielectric polymer or a dielectric film. For example, the underfill layer may include an epoxy-based polymer.

The package substrate 100U may be provided on its top surface with a molding layer 300 that is on and/or covers the semiconductor chip 200. Alternatively, the molding layer 300 may expose the top surface of the semiconductor chip 200. The molding layer 300 may include a dielectric polymer, such as an epoxy-based polymer. Alternatively, the underfill layer may be omitted, and the molding layer 300 may further extend through a gap between the package substrate 100U and the semiconductor chip 200.

In a strip substrate according to some embodiments of the present disclosure, a corner of power/ground patterns may have a chamfer shape on an area adjacent to a saw line region. For example, on the area adjacent to the saw line region, a distance between the power/ground patterns and conductive dummy patterns between the power/ground patterns may increase as the distance between the power/ground patterns and the saw line region decreases. Therefore, damage to the power/ground patterns may be prevented due to impurities that are introduced along the conductive dummy patterns from the saw line region or cutting surfaces of packages in a sawing process, and occurrences of short-circuit between the power/ground patterns and the conductive dummy patterns may be reduced. Accordingly, the present disclosure provides a method of fabricating a package substrate and a strip substrate with less occurrences of failure, a strip substrate with improved operating stability, a package substrate fabricated by using the strip substrate, and a semiconductor package including the package substrate.

In addition, the power/ground patterns may have a chamfer shape at only a corner adjacent to the saw line region, and a small distance may be provided between the power/ground patterns on an area that is not proximate to the saw line region. Thus, transmission power reductions of the package substrates caused by an increase in distance between the power/ground patterns may be prevented from transmission power reduction.

Although the present disclosure have been described in connection with some embodiments of the present disclosure illustrated in the accompanying drawings, it will be understood by one of ordinary skill in the art that variations in form and detail may be made therein without departing from the spirit and essential feature of the present disclosure. The above disclosed embodiments should thus be considered illustrative and not restrictive.

What is claimed is:

1. A strip substrate, comprising:
a dielectric layer comprising a unit region and a saw line region;
a saw line pattern on the saw line region of the dielectric layer;
a conductive dummy pattern that extends from the saw line pattern and toward the unit region; and
a plurality of power/ground patterns on the unit region,
wherein the conductive dummy pattern is between the plurality of power/ground patterns, and
wherein each of the plurality of power/ground patterns includes:
a first lateral surface that extends in a first direction and is proximate to the saw line pattern;
a second lateral surface that extends in a second direction and is proximate to the conductive dummy pattern, wherein the second direction intersects the first direction; and
a third lateral surface that connects the first lateral surface and the second lateral surface to each other.

2. The strip substrate of claim 1, wherein a distance between the third lateral surface and the conductive dummy pattern increases as a distance between the third lateral surface and the saw line pattern decreases.

3. The strip substrate of claim 1, wherein the third lateral surface includes a flat surface or a concave surface.

4. The strip substrate of claim 3, wherein:
the third lateral surface includes the flat surface, and
an angle between the third lateral surface and one of the first lateral surface and the second lateral surface is in a range of about 120 degrees to about 150 degrees.

5. The strip substrate of claim 1, wherein the third lateral surface includes:
a fourth lateral surface connected to the first lateral surface and parallel to the second lateral surface; and
a fifth lateral surface connected to the second lateral surface and the fourth lateral surface and parallel to the first lateral surface, wherein a distance between the conductive dummy pattern and the fourth lateral surface is greater than a distance between the conductive dummy pattern and the second lateral surface.

6. The strip substrate of claim 1, wherein each of the plurality of power/ground patterns include a metal plate pattern.

7. The strip substrate of claim 1, wherein:
a distance between the saw line pattern and the first lateral surface of a power/ground pattern from among the plurality of power/ground patterns is in a range of about 50 micrometers to about 150 micrometers, and
a distance between the conductive dummy pattern and the second lateral surface of the power/ground pattern is in a range of about 10 micrometers to about 30 micrometers.

8. The strip substrate of claim 1, wherein a distance between the third lateral surface and the conductive dummy pattern is greater than or equal to a distance between the second lateral surface and the conductive dummy pattern.

9. The strip substrate of claim 1, further comprising:
a plurality of solder pads on the unit region of the dielectric layer, and wherein the plurality of solder pads are laterally arranged on and connected to the conductive dummy patterns; and
a dielectric protection layer on the dielectric layer, the saw line pattern, and the conductive dummy patterns.

10. A semiconductor package, comprising:
a package substrate comprising a lateral surface, a top surface, and a bottom surface opposite to the top surface;
a semiconductor chip on the top surface of the package substrate; and
a solder terminal on the bottom surface of the package substrate,
wherein the package substrate includes:
a dielectric layer;
a solder pad between the solder terminal and the dielectric layer;
a conductive dummy pattern on the dielectric layer, wherein the conductive dummy pattern extends from the solder pad toward the lateral surface of the package substrate, and wherein a portion of the conductive dummy pattern is exposed at the lateral surface of the package substrate; and
a plurality of power/ground patterns proximate to the lateral surface and on the dielectric layer,
wherein the conductive dummy pattern is between the plurality of power/ground patterns,
wherein each of the plurality of power/ground patterns includes:
a first part; and
a second part between the first part and the lateral surface of the package substrate,
wherein a first distance between the first part and the conductive dummy pattern in a first direction is constant,
wherein a second distance between the second part and the conductive dummy pattern in a second direction increases as a third distance between the second part and the lateral surface of the package substrate in the first direction decreases, and
wherein the second direction intersects the first direction.

11. The semiconductor package of claim 10, wherein the second distance is greater than the first distance.

12. The semiconductor package of claim 10, wherein the first distance is in a range of about 10 micrometers to about 30 micrometers, and the second distance is greater than or equal to the first distance.

13. The semiconductor package of claim 10, wherein the third distance is in a range of about 50 micrometers to about 150 micrometers.

14. The semiconductor package of claim 10, wherein:

the first part comprises a first lateral surface, the second part comprises a second lateral surface, and an angle between the second lateral surface and the first lateral surface is in a range of about 120 degrees to about 150 degrees.

15. The semiconductor package of claim 14, wherein the second lateral surface includes a substantially flat surface or a concave surface.

16. The semiconductor package of claim 14, wherein a power/ground pattern from among the plurality of power/ground patterns further includes a third part between the first part and the second part, wherein the third part has a third lateral surface, and wherein the third lateral surface is inclined to the first lateral surface and the second lateral surface.

17. The semiconductor package of claim 10, wherein the power/ground pattern comprises a metal plate pattern.

18. A strip substrate, comprising:

a dielectric layer;

a saw line pattern that extends in a first direction on the dielectric layer;

a plurality of metal plate patterns spaced apart from each other in the first direction;

a solder pad on the dielectric layer;

a conductive dummy pattern that extends from the solder pad and between the plurality of metal plate patterns, wherein the conductive dummy pattern is connected to the saw line pattern; and a dielectric protection layer on the dielectric layer, the saw line pattern, the plurality of metal plate patterns, and the conductive dummy pattern, wherein a first distance between the plurality of metal plate patterns and the conductive dummy pattern is in a range of about 10 micrometers to about 30 micrometers, wherein a second distance between the plurality of metal plate patterns and the saw line pattern is in a range of about 50 micrometers to about 150 micrometers, and wherein each of the plurality of metal plate patterns comprises a chamfer shape at a corner proximate to an intersection of the saw line pattern and the conductive dummy pattern.

19. The strip substrate of claim 18, wherein each of the plurality of metal plate patterns includes:

a first lateral surface that extends along the saw line pattern;

a second lateral surface that extends along the conductive dummy pattern; and a third lateral surface inclined to each of the first lateral surface and the second lateral surface.

20. The strip substrate of claim 19, wherein the third lateral surface includes a substantially flat surface or a concave surface.

\* \* \* \* \*